(12) United States Patent
Melanson

(10) Patent No.: US 10,764,681 B1
(45) Date of Patent: Sep. 1, 2020

(54) LOW-LATENCY AUDIO OUTPUT WITH VARIABLE GROUP DELAY

(71) Applicant: Cirrus Logic International Semiconductor Ltd., Edinburgh (GB)

(72) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/522,474

(22) Filed: Jul. 25, 2019

Related U.S. Application Data

(60) Provisional application No. 62/858,667, filed on Jun. 7, 2019, provisional application No. 62/870,152, filed on Jul. 3, 2019.

(51) Int. Cl.
*H04R 3/04* (2006.01)
*H04S 1/00* (2006.01)

(52) U.S. Cl.
CPC .............. *H04R 3/04* (2013.01); *H04S 1/007* (2013.01); *H04S 2400/09* (2013.01)

(58) Field of Classification Search
CPC ........ H04R 3/04; H04S 1/007; H04S 2400/09
USPC .............................................. 391/99; 700/94
See application file for complete search history.

(56) References Cited

U.S. PATENT DOCUMENTS

| | | | | |
|---|---|---|---|---|
| 5,157,395 A | * | 10/1992 | Del Signore | ...... H03H 17/0294 341/143 |
| 2007/0146185 A1 | * | 6/2007 | Kang | ................. H03H 17/0416 341/143 |
| 2011/0134980 A1 | | 6/2011 | Lipka et al. | |
| 2015/0140972 A1 | | 5/2015 | Zhang et al. | |
| 2016/0314805 A1 | | 10/2016 | Mortazavi et al. | |
| 2017/0110141 A1 | * | 4/2017 | Craven | ............... G10L 19/0204 |

OTHER PUBLICATIONS

Ear Level Engineering (oversampling, posted Oct. 19, 1996, written by Nigel Redmon) (Year: 1996).*

* cited by examiner

*Primary Examiner* — Vivian C Chin
*Assistant Examiner* — Douglas J Suthers
(74) *Attorney, Agent, or Firm* — Jackson Walker L.L.P.

(57) ABSTRACT

A system may include an input configured to receive a digital audio input signal having at least four and fewer than 65,000 quantization levels and sampled at at least 500 kilohertz, a low-pass filter configured to receive the digital audio input signal and perform filtering on the digital audio input signal to generate a filtered digital audio input signal having a bandwidth of between approximately 100 hertz and 10 kilohertz, a digital-to-analog converter configured to receive the filtered digital audio input signal and convert the filtered digital audio input signal into an equivalent analog audio input signal, and a driver configured to receive the equivalent analog audio input signal and drive an analog audio output signal to a transducer, wherein a group delay from the input to an output of the driver is less than 50 microseconds.

12 Claims, 2 Drawing Sheets

LOW-LATENCY AUDIO OUTPUT WITH VARIABLE GROUP DELAY

RELATED APPLICATIONS

The present disclosure claims priority to U.S. Provisional Patent Application Ser. No. 62/858,667, filed Jun. 7, 2019, and U.S. Provisional Patent Application Ser. No. 62/870,152 filed Jul. 3, 2019, both of which are incorporated by reference herein in their entirety.

FIELD OF DISCLOSURE

The present disclosure relates in general to circuits for electronic devices, including without limitation personal audio devices such as wireless telephones and media players, and more specifically, to providing a low-latency audio output path with a variable group delay in order to optimize filtering of out-of-band noise from the audio output path.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

In many audio output systems, it is desirable to have low latency, wherein latency may be defined as a duration of time it takes a digital audio input signal to be processed and reproduced as audible sound by a transducer. An example of a scenario in which low latency is desired is noise cancellation using one or more microphones in a feedback or feed forward system. It is often desirable for such audio system to operate at a high dynamic range with low power. Many will be battery operated and operate under a wide range of audio levels.

Out-of-band noise (e.g., noise at ultrasonic frequencies) present within an audio signal may cause undesirable dissipation of power in drivers, amplifiers, and other components of an audio system. Out-of-band noise may also spectrally fold into the audible audio band, leading to undesirable noise. Accordingly, to maximize dynamic range and minimize power, it may be desirable to reduce or eliminate out-of-band noise from an audio signal using out-of-band filtering. However, out-of-band filtering may introduce undesirable delay into an audio path.

SUMMARY

In accordance with the teachings of the present disclosure, one or more disadvantages and problems associated with existing approaches to out-of-band noise filtering may be reduced or eliminated.

In accordance with embodiments of the present disclosure, a system may include a filter configured to receive a digital audio input signal quantized at between two and 257 quantization levels and sampled at at least 500 kilohertz, the filter further configured to perform filtering on the digital audio input signal to generate a filtered digital audio input signal, the filter having a selectable variable group delay, a digital-to-analog converter configured to receive the filtered digital audio input signal and convert the filtered digital audio input signal into an equivalent analog audio input signal, and a driver configured to receive the equivalent analog audio input signal and drive an analog audio output signal to a transducer.

In accordance with these and other embodiments of the present disclosure, a method may include receiving a digital audio input signal quantized at between two and 257 quantization levels and sampled at at least 500 kilohertz, filtering, with a filter having a selectable variable group delay, the digital audio input signal to generate a filtered digital audio input signal, converting the filtered digital audio input signal into an equivalent analog audio input signal with a digital-to-analog converter, and driving an analog audio output signal based on the equivalent analog audio input signal to a transducer.

In accordance with these and other embodiments of the present disclosure, a system may include an input configured to receive a digital audio input signal having at least four and fewer than 65,000 quantization levels and sampled at at least 500 kilohertz, a low-pass filter configured to receive the digital audio input signal and perform filtering on the digital audio input signal to generate a filtered digital audio input signal having a bandwidth of between approximately 100 hertz and 10 kilohertz, a digital-to-analog converter configured to receive the filtered digital audio input signal and convert the filtered digital audio input signal into an equivalent analog audio input signal, and a driver configured to receive the equivalent analog audio input signal and drive an analog audio output signal to a transducer, wherein a group delay from the input to an output of the driver is less than 50 microseconds.

In accordance with these and other embodiments of the present disclosure, a method may include receiving a digital audio input signal having at least four and fewer than 65,000 quantization levels and sampled at at least 500 kilohertz, filtering the digital audio input signal with a low-pass to generate a filtered digital audio input signal having a bandwidth of between approximately 100 hertz and 10 kilohertz, converting the filtered digital audio input signal into an equivalent analog audio input signal with a digital-to-analog converter, and driving an analog audio output signal to a transducer based on the equivalent analog audio input signal, wherein a group delay from the input to an output of the driver is less than 50 microseconds.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
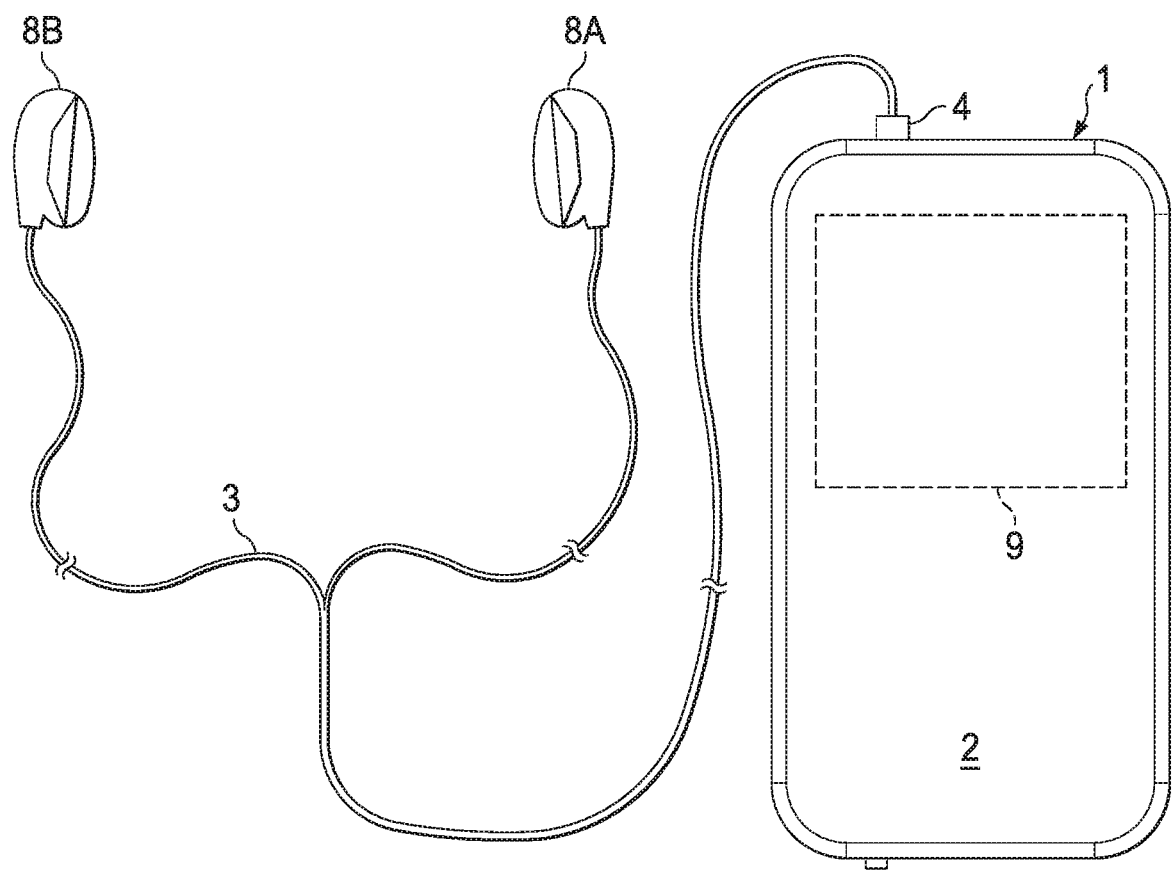
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
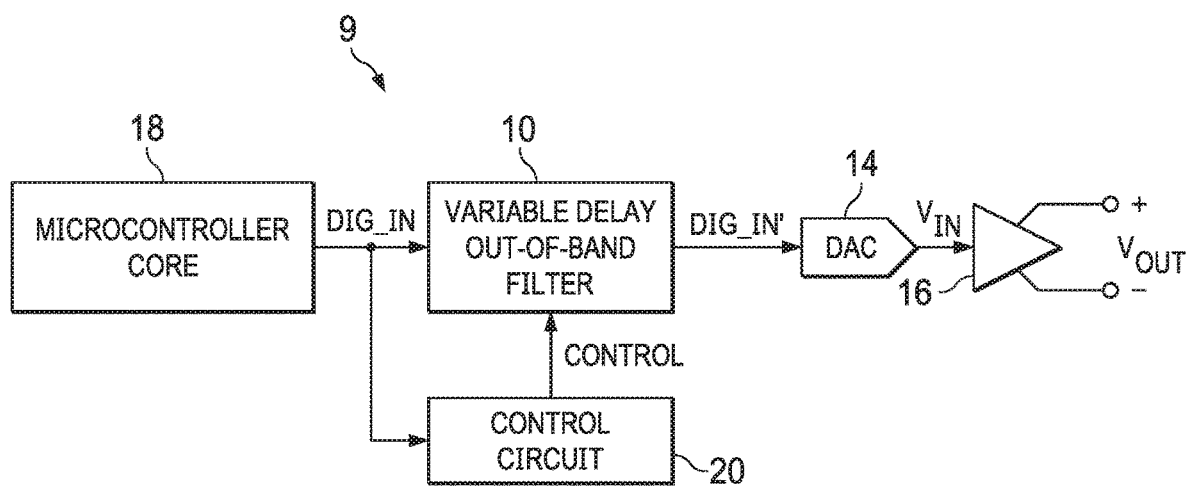
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN, which may comprise a modulated digital signal, such as a pulse-density modulated signal, for example. To have low latency between a digital audio input signal DIG_IN and output signal $V_{OUT}$, a high, oversampled rate (e.g., 500 KHz to 6 MHz) may be desired. In some embodiments, also to maintain lower out-of-band noise, digital audio input signal DIG_IN may comprise a quantized digital signal with between four and 65,000 quantization levels. In particular embodiments, digital audio input signal DIG_IN may comprise a quantized digital signal with at least sixteen quantization levels. In other particular embodiments, digital audio input signal DIG_ IN may comprise a quantized digital signal having between two and 257 quantization levels.

A variable delay out-of-band filter 10 may receive digital audio input signal DIG_IN and filter digital audio input signal DIG_IN in accordance with filter parameters of variable delay out-of-band filter 10 in order to generate filtered digital audio input signal DIG_IN'. In some embodiments, variable delay out-of-band filter 10 may be configured to generate filtered digital audio input signal DIG_IN' having a signal bandwidth between approximately 10 hertz and 10 kilohertz. Variable delay out-of-band filter 10 may comprise a low-pass filter having one or more filter characteristics (e.g., corner frequency, group delay, latency, filter order) which may be varied in response to one or more control signals CONTROL received from control circuit 20. Variable delay out-of-band filter 10 may comprise a finite impulse response filter or an infinite impulse response filter.

Control circuit 20 may receive digital audio input signal DIG_IN and based on one or more characteristics of digital audio input signal DIG_IN (e.g., signal magnitude of digital audio input signal DIG_IN), generate one or more control signals CONTROL for controlling one or more filter characteristics of variable delay out-of-band filter 10, as described in greater detail below. In addition, control circuit 20 may generate one or more control signals CONTROL for controlling one or more filter characteristics of variable delay out-of-band filter 10 based on whether digital audio input signal DIG_IN is being used for real-time feedforward or real-time feedback processing (e.g., as would be the case when digital audio input signal DIG_IN is used in an active noise cancellation application).

Although FIG. 2 depicts control circuit 20 generating one or more control signals based on one or more characteristics of digital audio input signal DIG_IN, in other embodiments, control circuit 20 may generate one or more control signals CONTROL based on other factors (e.g., user-selected settings).

As shown in FIG. 2, audio IC 9 may also include a digital-to-analog converter (DAC) 14, which may convert filtered digital audio input signal DIG_IN' to an analog signal $V_{IN}$. DAC 14 may supply analog signal $V_{IN}$ to an amplifier 16 which may amplify or attenuate audio input signal $V_{IN}$ to provide an audio output signal $V_{OUT}$, which may operate a speaker, a headphone transducer, a line level signal output, and/or other suitable output. In some embodiments, amplifier 16 may drive audio output signal $V_{OUT}$ at a voltage of between approximately one milliwatt and approximately 100 milliwatts to an output transducer having an impedance of between approximately two ohms and approximately 100 ohms. Although shown in FIG. 2 as a differential signal, in some embodiments, audio output signal $V_{OUT}$ may be a single-ended signal. In some embodiments, DAC 14 may be an integral component of amplifier 16.

Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
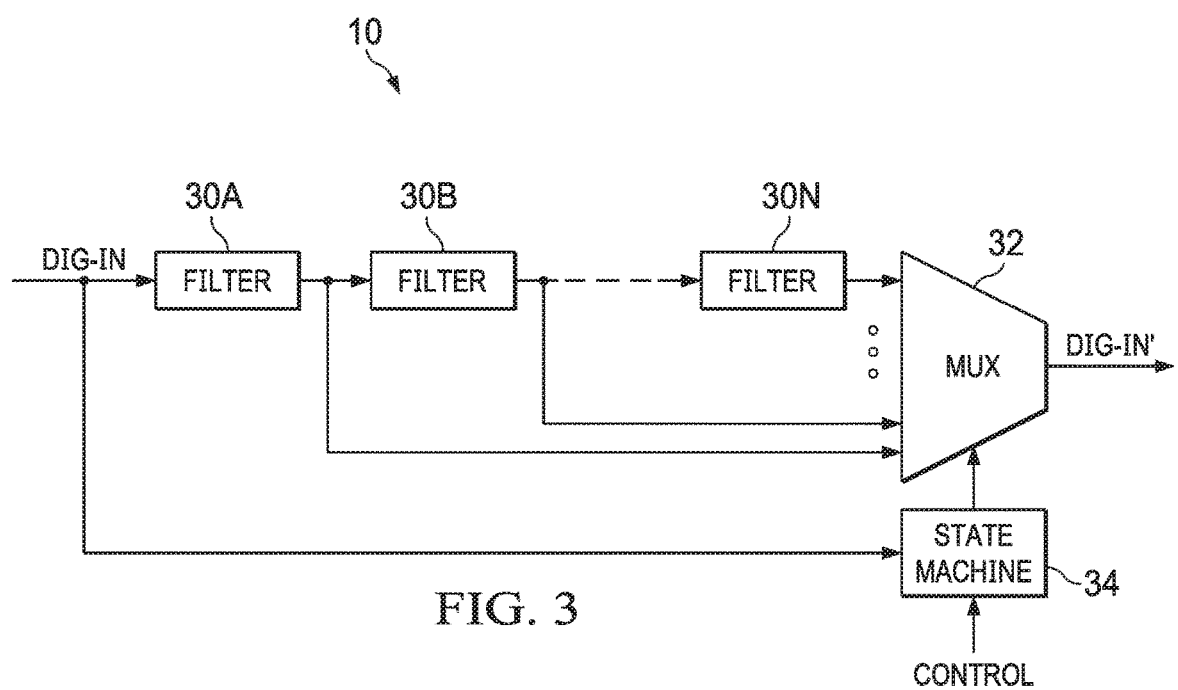
FIG. 3 illustrates a block diagram of selected components of an example variable latency out-of-band noise filter, in accordance with embodiments of the present disclosure.

FIG. 3 illustrates a block diagram of selected components of an example variable latency out-of-band noise filter 10, in accordance with embodiments of the present disclosure. In some embodiments, variable latency out-of-band noise filter 10 may be used to implement variable latency out-of-band noise filter 10 shown in FIG. 2.

As shown in FIG. 3, variable latency out-of-band noise filter 10 may comprise a plurality of individual filter elements 30 (e.g., filter elements 30A, 30B, . . . , 30N), coupled in series fashion such that an output of one filter element 30 may serve as an input of a subsequent filter element 30, wherein first filter element 30A may receive digital audio input signal DIG_IN, perform low-pass filtering on digital audio input signal DIG_IN, and output such filtered signal to the input of second filter element 30B and an input of multiplexer 32. Similarly, second filter element 30B may receive digital audio input signal DIG_IN, perform further low-pass filtering on digital audio input signal DIG_IN as filtered by first filter element 30A, and output such filtered signal to the input of a third filter element 30 and an input of multiplexer 32. All subsequent filter elements 30 may receive the output of the filter element 30 that comes before it, communicating its result to the input of multiplexer 32 and (except for the final filter 30N) to another subsequent filter element 30.

A state machine 34 may receive one or more control signals from control circuit 20, and further process such one or more control signals in order to control multiplexer 32 to select a desired filter element output to be output as filtered digital audio input signal DIG_IN'. If robust filtering is desired, an output from a later stage filter element 30 (e.g., higher-order filtering) may be selected, at the cost of increased latency. If robust filtering is not desired, an output from an earlier stage filter element 30 (e.g., lower-order filtering) may be selected. For example, for higher magnitude signals which may better mask out-of-band noise, the one or more control signals from control circuit 20 may cause variable latency out-of-band noise filter 10 to operate with lower-order filtering (e.g, causing multiplexer 32 to select the output of filter element 30A). Conversely, for lower magnitude signals which may not mask out-of-band noise, the one or more control signals from control circuit 20 may cause variable latency out-of-band noise filter 10 to operate with higher-order filtering (e.g, causing multiplexer 32 to select the output of filter element 30N).

State machine 34 may also be configured to control switching among delay modes of variable latency out-of-band noise filter 10 at particular points of time in order to reduce switching artifacts (e.g., audible pops and clicks) that might otherwise occur. For example, by receiving digital audio input signal DIG_IN as an input signal, state machine 34 may be configured to switch among delay modes at or proximate to zero crossings of digital audio input signal DIG_IN. As selection is changed among the outputs of filter elements 30, state machine 34 may also implement a cross-fading approach that slowly transitions between selections (e.g., by slowly decreasing a weight of a de-selected mode while slowly increasing a weight of a selected mode). In addition or alternatively, state machine 34 may slowly change coefficients when switching from one delay mode to another delay mode.

Although FIG. 3 shows control signals being used to select an order (and thus a latency) of variable latency out-of-band noise filter 10, in some embodiments, the one or more control signals CONTROL received by variable latency out-of-band noise filter 10 may control a cut off frequency applied by the filtering of filter elements 30 (e.g., a cutoff frequency of 250 KHz for high signal magnitudes, reducing to 25 KHz for lower signal magnitudes). Further, in some embodiments, the one or more control signals CONTROL received by variable latency out-of-band noise filter 10 may control other characteristics of variable latency out-of-band noise filter 10 and/or filter elements 30 besides order, latency, and corner frequency.

Although FIG. 3 represents an architecture for some embodiments of variable latency out-of-band noise filter 10, the present disclosure expressly contemplates other architectures for providing a variable latency out-of-band noise filter having one or more characteristics based on one or more characteristics of an audio signal. For example, variable latency out-of-band noise filter 10 may be implemented with multiple filters with a cross-fade of outputs of the multiple filters as shown in FIG. 3. However, other architectures may, in addition to or in lieu of the architecture described above, implement a filter with time-varying coefficients, implement a filter with varying structure, and/or implement any other suitable features.

Using the methods and systems herein may enable a small group delay (e.g., less than 50 μs) from the input of variable latency out-of-band noise filter 10 and the output of amplifier 16.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. A system, comprising:
   an input configured to receive a digital audio input signal having at least four and fewer than 65,000 quantization levels and sampled at at least 500 kilohertz;
   a low-pass filter configured to receive the digital audio input signal and perform filtering on the digital audio input signal to generate a filtered digital audio input signal having a bandwidth of between approximately 100 hertz and 10 kilohertz;

a digital-to-analog converter configured to receive the filtered digital audio input signal and convert the filtered digital audio input signal into an equivalent analog audio input signal; and a driver configured to receive the equivalent analog audio input signal and drive an analog audio output signal to a transducer;

wherein a group delay from the input to an output of the driver is less than 50 microseconds.

2. The system of claim 1, wherein the low-pass filter has a variable group delay.

3. The system of claim 2, wherein the variable group delay is selected based on one or more signal characteristics of the digital audio input signal.

4. The system of claim 3, wherein the one or more signal characteristics of the digital audio input signal comprise a magnitude of the digital audio input signal.

5. The system of claim 2, wherein the variable group delay is selected based on whether the digital audio input signal is being used for real-time feedback or real-time feedforward processing.

6. The system of claim 1, wherein the filter is configured to switch between a first mode in which the filter has a first variable group delay and a second mode in which the filter has a second variable group delay in a manner that minimizes audible audio artifacts associated with such switching.

7. A method, comprising:

receiving a digital audio input signal having at least four and fewer than 65,000 quantization levels and sampled at at least 500 kilohertz;

filtering the digital audio input signal with a low-pass to generate a filtered digital audio input signal having a bandwidth of between approximately 100 hertz and 10 kilohertz;

converting the filtered digital audio input signal into an equivalent analog audio input signal with a digital-to-analog converter; and driving an analog audio output signal to a transducer based on the equivalent analog audio input signal;

wherein a group delay from the input to an output of the driver is less than 50 microseconds.

8. The method of claim 7, wherein the low-pass filter has a variable group delay.

9. The method of claim 8, further comprising selecting the variable group delay based on one or more signal characteristics of the digital audio input signal.

10. The method of claim 9, wherein the one or more signal characteristics of the digital audio input signal comprise a magnitude of the digital audio input signal.

11. The method of claim 8, further comprising selecting the variable group delay based on whether the digital audio input signal is being used for real-time feedback or real-time feedforward processing.

12. The method of claim 7, further comprising switching between a first mode in which the filter has a first variable group delay and a second mode in which the filter has a second variable group delay in a manner that minimizes audible audio artifacts associated with such switching.

* * * * *